United States Patent
Ogure et al.

(10) Patent No.: US 6,458,694 B2
(45) Date of Patent: Oct. 1, 2002

(54) HIGH ENERGY SPUTTERING METHOD FOR FORMING INTERCONNECTS

(75) Inventors: Naoaki Ogure; Takao Kato, both of Tokyo; Kuniaki Horie, Yamato; Yuji Araki, Fujisawa, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/767,145

(22) Filed: Jan. 23, 2001

(30) Foreign Application Priority Data

| Jan. 24, 2000 | (JP) | 2000-014919 |
| Feb. 8, 2000 | (JP) | 2000-030422 |
| Feb. 17, 2000 | (JP) | 2000-039661 |
| Nov. 2, 2000 | (JP) | 2000-335906 |

(51) Int. Cl.[7] .................. H01L 21/443; H01L 21/445
(52) U.S. Cl. .................. 438/652; 438/675; 438/676; 438/687
(58) Field of Search ............... 438/679, 638, 438/687, 642, 652, 675, 678, 676, 637

(56) References Cited

U.S. PATENT DOCUMENTS

| 6,022,808 A | * 2/2000 | Nogami et al. ............ 438/694 |
| 6,051,114 A | * 4/2000 | Yao et al. ................ 204/192.3 |
| 6,113,761 A | * 9/2000 | Kardokus et al. ...... 204/298.13 |
| 6,139,701 A | * 10/2000 | Pavate et al. .......... 204/192.17 |
| 6,187,622 B1 | * 2/2001 | Kuroiwa et al. ............ 438/240 |
| 2001/0034126 A1 | * 10/2001 | Ding et al. ................ 438/687 |

* cited by examiner

*Primary Examiner*—Olik Chaudhuri
*Assistant Examiner*—Stephen W. Smoot
(74) *Attorney, Agent, or Firm*—Wenderoth, Lind & Ponack, L.L.P.

(57) ABSTRACT

The present invention relates to a method and apparatus for forming interconnects on a substrate such as a semiconductor wafer by filling a conductive material such as copper (Cu) in fine recesses formed in a surface of the substrate. A method for forming interconnects comprises providing a substrate and a target composed of a conductive material in confrontation with each other in a chamber, introducing a sputtering gas into the chamber while a high voltage is applied between the substrate and the target to cause the sputtering gas to collide with the target, and depositing particles of the conductive material emitted from the target on the surface of the substrate to form a thin film, while sputter-etching the thin film by reflection sputtering gas molecules reflected from the target and having high energy.

8 Claims, 11 Drawing Sheets

Substrate temperature: 200°C
Pressure: 1×10⁻¹ Pa

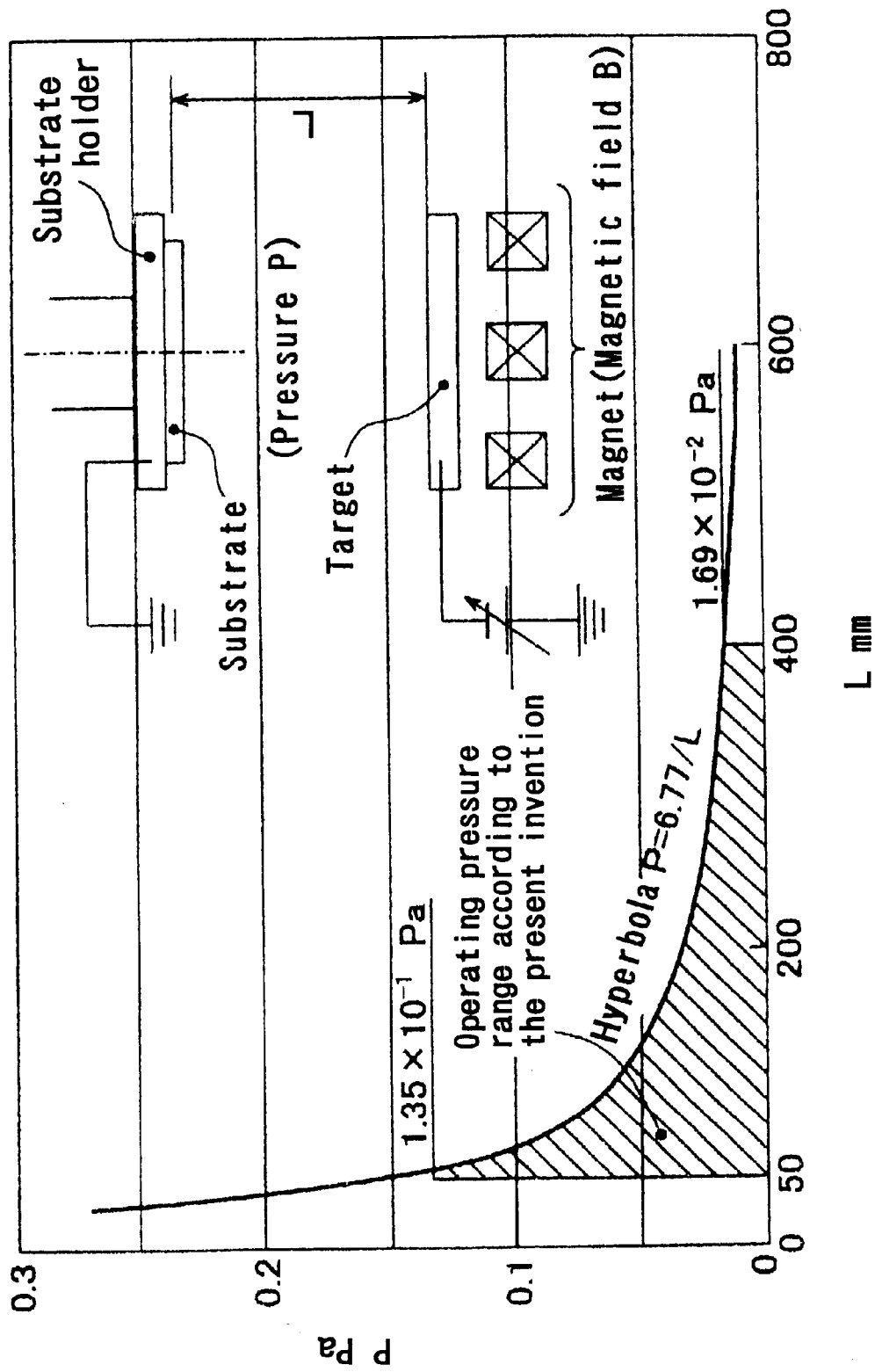

HIGH ENERGY SPUTTERING METHOD FOR FORMING INTERCONNECTS

BACKGROUND OF THE INVENTION

1. Field of the Invention

The present invention relates to a method and apparatus for forming interconnects (wiring), and more particularly to a method and apparatus for forming interconnects (wiring) on a substrate such as a semiconductor wafer by filling conductive materials such as copper (Cu) in fine recesses formed in a surface of the substrate in a predetermined interconnect pattern.

2. Description of the Related Art

Generally, aluminum or aluminum alloys have been used as a material for forming interconnects (wiring) for a semiconductor. However, in recent years, there has been a growing tendency to replace aluminum with copper for the following reasons: Copper has excessively low electric resistivity of 1.72 $\mu\Omega$ cm which is about 40% lower than that of aluminum, and hence copper has the advantage of reduced RC delay phenomenon and has higher resistance against electromigration damage than aluminum. For example, even if current density increases up to $1\times10^6$ or 1M A/cm$^2$ or more due to a drastic reduction in a cross-sectional area of a line, there is little probability that electromigration occurs in the interior of the line. Further, copper is more suitable for dual damascene process than aluminum, and has a high capability that a complicated and fine structure of multi-level interconnections can be manufactured at a low cost.

In order to form fine wiring or interconnects with copper, since practical dry etching process of copper has not been established, it is inevitable to employ the so-called damascene process in which copper is filled into patterned trenches and vias preformed in insulating layers of a semiconductor substrate.

As a means for filling copper into the minute trenches or vias by the damascene process, there are various ways including CVD, sputter deposition (sputtering), electroplating, and the like. Among these processes, the sputter deposition which combines film deposition by sputtering and heating has the advantage of high deposition rate with excellent film quality. In addition, existing sputtering apparatuses and technology for depositing aluminum are still usable.

In the film deposition by sputtering (sputter deposition), a substrate and a target are disposed in confrontation with each other in a chamber, a high voltage is applied between the substrate and the target, and a sputtering gas is introduced into the chamber. Thus, high-energy particles such as ions of sputtering gas which have been ionized and accelerated collide with the target to cause particles of the target material to be sputtered and emitted from the target, and the emitted particles of the target material are deposited over the substrate to thus fill the target material into the minute trenches or vias for thereby forming patterned interconnects.

However, this sputtering process is problematic for its poor step coverage characteristic, i.e., capability of covering portions having difference in level, is low, because sputtered atoms travel straight. FIG. 10 is a schematic view showing the state of an overhang of copper formed at an inlet portion of a fine recess after copper as a metalizing material is deposited to fill the fine recess for preparing interconnects.

As shown in FIG. 10, when copper as a wiring material is filled by the sputter deposition process in a fine recess 102a formed in a substrate 102, copper atoms emitted from the target travel straight and are deposited in a concentrated manner at the inlet portion of the recess 102a, thus forming the overhang portion (projecting portion) A. If the overhang portion A is formed at the inlet portion of the recess 102a, then the inlet portion of the recess 102a is blockaded by copper 104 before copper atoms are sufficiently deposited in the interior of the recess 102a. Therefore, after this blockade occurs, it prevents copper from being filled into the interior of the recess 102a, and the coating or filling process cannot help finishing with a void-like defect B left. Thus, it is generally considered that because of presence of the overhang portion A, the minimum size capable of coating or filling copper by the sputter deposition is in the range of 0.13 to 0.15 $\mu$m.

When interconnects are formed by filling copper or copper alloy as a conductive material in the recess by the sputter deposition process, it has heretofore been customary to use metallic materials having a desired crystal grain size, mechanical properties and surface condition by applying a suitable plastic working, heat treatment and machining.

In order to properly machine the target into a desired configuration, as described above, it is necessary to adjust hardness of the metallic materials by suitable heat treatment, particularly, the final annealing. FIG. 11 shows the relationship between annealing temperature of copper (oxygen free copper A, electrolytic copper B, and phosphorus deoxidized copper C) and Vickers hardness. As is apparent from FIG. 11, as the annealing temperature rises, the Vickers hardness decreases drastically, and when the annealing temperature rises from 400° C. to 800° C., the Vickers hardness gradually decreases by about 10. Thus, in order to sufficiently lower the hardness of the target, the annealing should be carried out at a temperature of 600° C. or higher.

FIG. 12 shows the relationship between annealing temperature of pure copper with 5% or less compressive work strain and its crystal grain size obtained at such annealing temperature. As shown in FIG. 12, annealing at a temperature of 600° C. makes a fairly great copper grain size of approximately 300 $\mu$m, for example, with lowered hardness. Difference in target grain size is assumed to create varied deposition result. Specifically, it is considered that if the target crystal grain size exceeds the allowable limit, sputtered copper atoms travel in random directions, remarkably impairing perpendicular travel, due to various crystal orientation of the surface of the target. The traveling direction of copper atoms which have been sputtered, i.e., copper atoms emitted from the target due to collision of high-energy particles with the target, varies with the crystal orientation of the target. Therefore, if the target and the substrate are parallelly faced with each other, filling characteristic of copper atoms into the minute recesses formed perpendicularly to the surface of the substrate is greatly impaired, because a number of atoms travel in oblique directions.

FIG. 13 shows the results of filling copper into a minute via formed in a surface of a semiconductor substrate using a copper target of large grains whose diameter is approximately 200 $\mu$m, obtained by annealing thereof at a high temperature described above. As shown in FIG. 13, copper 114 is not deposited in the interior of a via 112 having a diameter of approximately 0.15 $\mu$m, formed in the surface of the semiconductor substrate 110, except for an inlet portion of the via 112, and the upper part of the via 112 is blockaded while leaving a void 116. Therefore, it is difficult or impossible to form copper wiring or interconnects having sufficient current capacity. This is presumably caused by oblique traveling characteristic of copper atoms which have been sputtered.

Conventionally, in the semiconductor device having a wiring circuit with a width of 0.13 μm or less, it has been generally understood that the optimum process consists of formation of the seed layer by sputter deposition, followed by copper electroplating metalization. The primary purpose of the seed layer is that the seed layer serves as an electrolytic cathode for supplying a sufficient amount of current to reduce metal ions in the plating liquid and to precipitate and deposit solid metal on the substrate. This is because as long as the seed layer remains satisfactory, there exists a high possibility of simultaneously realizing three factors; excellent filling property, high conductivity, and electromigration resistance with electroplating. Therefore, in order to perform electroplating, it is indispensable to form a thin seed layer of conductive material uniformly and continuously over the entire inner surface of the recess. For example, when fine wiring of copper is to be formed by the damascene process, a thin seed layer of the same material as wiring material, i.e. copper is formed prior to electroplating.

In general, when a thin film (layer) is formed by sputter deposition, the deposited material, in some cases, forms a less uniform thickness layer, which is less conformable to the underlayer, and forms a granular, rough surface. This behavior can be explained in terms of surface diffusion of the deposited material depending on the interaction between the thin film and the underlayer material, and the elevated temperature. Conventionally, aluminum or aluminum alloy is deposited relatively easily and uniformly on a barrier layer of TaN or TiN or the like by sputter deposition. However, sputtered and deposited copper atoms normally agglomerate on the barrier layer of TaN or TiN or the like during high temperature sputter deposition process to thus form a granular and discontinuous film, rarely producing a thin and uniform thickness deposition. If copper atoms agglomerate on a large scale to form nonuniform copper seed layer on the barrier layer, the plating current flowing through the seed layer becomes insufficient.

Further, if the seed layer has film defect, it is impossible to cause plating current to flow through such defective portion. A defective plated portion is liable to develop on an incomplete seed layer in the subsequent plating process. This holds true for electroless plating on a catalytic layer as an underlying layer, in place of the seed layer for the electroplating.

In order to solve the above problems, the substrate is cooled during sputter deposition at a low temperature to prevent an improper surface diffusion. However, because of temperature rise of the portion near the top surface of the substrate due to plasma irradiation or various uncertain factors at the plasma side, the substrate cooling might not necessarily work in present sputtering apparatuses.

SUMMARY OF THE INVENTION

It is therefore an object of the present invention to provide a method and apparatus for forming interconnect (wiring) which can fill a conductive material such as copper into a minute recess such as vias or trenches for forming interconnect provided on a surface of a substrate by film deposition by sputtering (sputter deposition) to thus obtain a satisfactory interconnect structure having no defect.

Another object of the present invention is to provide a method and apparatus for forming interconnect, and a target material which can suppress oblique traveling characteristic of sputtered atoms, cause the sputtered atoms to enter the deepest portion of a minute recess formed in the surface of the substrate, and coat or fill a conductive material into the interior of the minute recess without generating a defective portion or void.

Still another object of the present invention is to provide a method and apparatus for forming an underlying layer having a uniform thickness by suppressing generation of agglomeration on an interior surface of a minute recess, and forming satisfactory interconnect embedded in the recess and having no effect.

According to a first aspect of the present invention, there is provided a method for forming interconnect on a substrate by filling a conductive material in a fine recess formed in a surface of the substrate, the method comprising: providing a substrate and a target composed of a conductive material in confrontation with each other in a chamber; introducing a sputtering gas into the chamber while a high voltage is applied between the substrate and the target to cause the sputtering gas to collide with the target; and depositing particles of the conductive material emitted from the target on the surface of the substrate to form a thin film, while sputter-etching the thin film by reflection sputtering gas molecules reflected from the target and having high energy.

According to the present invention, neutral reflection sputtering gas molecules (reflection sputtering gas particles) are mixed with the conductive material particles emitted from the target and collide with the surface of the substrate to thus perform sputter etching of the conductive material layer deposited on the surface of the substrate, particularly, the conductive material deposited in a relatively thick state on the portion near the inlet of the fine recess (typically the overhang portion A in FIG. 10) preferentially. Therefore, the conductive material particles enter the interior and the depth of the recess and easily deposited therein.

In a preferred aspect of the present invention, a potential difference E(V) between the substrate and the target is set to a range which is expressed by the following equation (1);

$$30/A \leq E \leq 500/A \tag{1}$$

here, $A = [(M_S - M_G)/(M_S + M_G)]^2$ where $M_S$ represents atomic weight of the target, and $M_G$ represents atomic weight of the sputtering gas; and the distance L (mm) between the substrate and the target is set to a range which satisfies the following equations (2) and (3);

$$\lambda \geq L \tag{2}$$

$$50 \leq L \leq 400 \tag{3}$$

where λ (mm) represents mean free path of the reflection sputtering gas molecules.

In the above aspect, the potential difference E between the substrate and the target is set to 30/A or more, and the sputtering gas such as argon gas which has been introduced into the chamber is ionized and accelerated by the electric field to form high-energy particles. Then, a part of the high-energy particles is neutralized and reflected from the surface of the target and becomes neutral reflection sputtering gas molecules having a sufficiently high energy for sputter etching. Further, the potential difference E between the substrate and the target is set to 500/A or less, thus preventing silicon semiconductor devices from being damaged.

Further, the distance L between the substrate and the target is set to the mean free path λ or less, and hence the limited distance L mostly suppresses scattering caused by collision of the neutral reflection sputtering gas molecules with each other or resultant attenuation of kinetic energy. Thus, the sputter etching action of the neutral reflection sputtering gas molecules is prevented from being reduced.

Further, the distance L between the substrate and the target set to 400 mm or less prevents the conductive material particles which reach the substrate from being reduced. The distance L between the substrate and the target set to 50 mm or more avoids the damage to semiconductor devices caused by collision of the high energy conductive material particles or secondary electrons.

In a preferred aspect of the present invention, the sputtering gas comprises argon gas, and a pressure P (Pa) in the chamber is set to a range which satisfies P≦6.77/L.

In case of using argon gas having an ambient temperature (20° C.) as a sputtering gas, the mean free path λ of the argon gas including neutral reflection sputtering gas molecules (gas molecules) is expressed by λ=6.77/P. Therefore, the distance L between the substrate and the target and the pressure P in the chamber are set so as to satisfy the requirement of P≦6.77/L, and hence the requirement of above equation (2) is satisfied.

In a preferred aspect of the present invention, the sputtering gas comprises argon gas, the target comprises copper, and the potential difference E between the substrate and the target is in the range of 0.6 to 10 kV.

In the case where argon gas is used as a sputtering gas and copper is used as a target, because the above value A becomes 0.05, the requirement of the above equation (1) can be satisfied by setting the potential difference E to the above range.

In a preferred aspect of the present invention, the substrate comprises a semiconductor substrate, and the target comprises copper, tantalum, titanium, tungsten, or alloy or compound containing at least one of these elements.

According to a second aspect of the present invention, there is provided an apparatus for forming interconnect on a substrate by filling a conductive material in a fine recess formed in a surface of the substrate, the apparatus comprising: a chamber for providing a substrate and a target composed of a conductive material in confrontation with each other therein; a power supply for applying a high voltage between the substrate and the target; and a gas introducing passage for introducing a sputtering gas into the chamber to cause the sputtering gas to collide with the target; wherein particles of the conductive material emitted from the target by collision of the sputtering gas are deposited on the surface of the substrate to form a thin film, while sputter-etching the thin film by reflection sputtering gas molecules reflected from the target and having high energy.

In a preferred aspect of the present invention, a potential difference E(V) between the substrate and the target is set to a range which is expressed by the following equation (1);

$$30/A \leq E \leq 500/A \quad (1)$$

here, $A=[(M_S-M_G)/(M_S+M_G)]^2$ where $M_S$ represents atomic weight of the target, and $M_G$ represents atomic weight of the sputtering gas; and the distance L (mm) between the substrate and the target is set to a range which satisfies the following equations (2) and (3);

$$\lambda \geq L \quad (2)$$

$$50 \leq L \leq 400 \quad (3)$$

where λ (mm) represents mean free path of the gas inside the chamber.

In a preferred aspect of the present invention, the sputtering gas comprises argon gas, and a pressure P (Pa) in the chamber is set to a range which satisfies P≦6.77/L.

In a preferred aspect of the present invention, the sputtering gas comprises argon gas, the target comprises copper, and the potential difference E between the substrate and the target is in the range of 0.6 to 10 kV.

According to a third aspect of the present invention, there is provided a method for forming interconnect on a substrate by filling a conductive material in a fine recess formed in a surface of the substrate, the method comprising: providing a substrate and a target composed of a conductive material having crystal grains whose diameter is not greater than 70 μm in confrontation with each other in a chamber; introducing a sputtering gas into the chamber while a high voltage is applied between the substrate and the target to cause the sputtering gas to collide with the target; and depositing particles of the conductive material emitted from the target by collision of the sputtering gas on the surface of the substrate to form a thin film.

Because the target comprising a conductive material having crystal grains whose diameter is equal to or less than 70 μm is used, the target contains many crystal grains having various crystal orientations, and the conductive material particles (sputtered atoms) can be emitted from the target toward various directions. Thus, the conductive material particles which travel in oblique directions collide with each other and the random traveling directions of the conductive material particles can be relaxed and averaged.

In a preferred aspect of the present invention, the voltage applied between the substrate and the target is equal to or more than 1000 V.

According to the present invention, a relatively high voltage is applied between the substrate and the target comprising a conductive material having crystal grains whose diameter is equal to or less than 70 μm, the conductive material particles emitted from the target toward every direction interfere with each other and are averaged on the whole, and mainly the conductive material particles which travel in a vertical direction (direction perpendicular to the surface of the substrate) reach the substrate. Thus, coating or filling capability of the fine recess formed in the substrate is improved. Therefore, in the case where the applied voltage between the substrate and the target is equal to or higher than 1000 V, the effect of the target having small crystal grains is remarkable due to the intensified etching rate by the reflection sputtering gas molecules.

According to a fourth aspect of the present invention, there is provided a method for forming interconnect on a substrate by filling a conductive material in a fine recess formed in a surface of the substrate, the method comprising: providing a substrate and a target composed of a conductive material having crystal grains whose diameter is not greater than 60 μm in confrontation with each other in a chamber; introducing a sputtering gas into the chamber while a high voltage is applied between the substrate and the target to cause the sputtering gas to collide with the target; and depositing particles of the conductive material emitted from the target by collision of the sputtering gas on the surface of the substrate to form a thin film.

According to the present invention, the number of crystal grains having various crystal orientations increases, and the conductive material particles (sputtered atoms) can be emitted from the target toward more various directions.

In a preferred aspect of the present invention, the voltage applied between the substrate and the target is equal to or more than 1000 V.

In the above aspect, a high voltage which is equal to or more than 1000 V is applied between the substrate and the target comprising crystal grains whose diameter is not more than 60 μm. Thus, the above effect is further promoted.

According to a fifth aspect of the present invention, there is provided an apparatus for forming interconnect on a substrate by filling a conductive material in a fine recess formed in a surface of the substrate, the apparatus comprising: a chamber for providing a substrate and a target composed of a conductive material having crystal grains whose diameter is not greater than 70 μm in confrontation with each other therein; a power supply for applying a high voltage between the substrate and the target; and a gas introducing passage for introducing a sputtering gas into the chamber to cause the sputtering gas to collide with the target; wherein particles of the conductive material emitted from the target by collision of the sputtering gas are deposited on the surface of the substrate to form a thin film.

In a preferred aspect of the present invention, the voltage applied between the substrate and the target is equal to or more than 1000 V.

According to a sixth aspect of the present invention, there is provided an apparatus for forming interconnect on a substrate by filling a conductive material in a fine recess formed in a surface of the substrate, the apparatus comprising: a chamber for providing a substrate and a target composed of a conductive material having crystal grains whose diameter is not greater than 60 μm in confrontation with each other therein; a power supply for applying a high voltage between the substrate and the target; and a gas introducing passage for introducing a sputtering gas into the chamber to cause the sputtering gas to collide with the target; wherein particles of the conductive material emitted from the target by collision of the sputtering gas are deposited on the surface of the substrate to form a thin film.

In a preferred aspect of the present invention, the voltage applied between the substrate and the target is equal to or more than 1000 V.

According to a seventh aspect of the present invention, there is provided a target material for use in a target provided in an apparatus for forming interconnect on a substrate, the target emitting particles by causing a sputtering gas to collide with the target, the particles being deposited on the surface of the substrate to form a thin film, the target material comprising: a conductive material having crystal grains whose diameter is equal to or less than 70 μm.

In a preferred aspect of the present invention, the conductive material comprises one of copper and copper alloys.

According to an eighth aspect of the present invention, there is provided a target material for use in a target provided in a apparatus for forming interconnect on a substrate, the target emitting particles by causing a sputtering gas to collide with the target, the particles being deposited on the surface of the substrate to form a thin film, the target material comprising: a conductive material having crystal grains whose diameter is equal to or less than 60 μm.

In a preferred aspect of the present invention, the conductive material comprises one of copper and copper alloys.

According to a ninth aspect of the present invention, there is provided a method for forming interconnect on a substrate by filling a first conductive material in a fine recess formed in a surface of the substrate with plating, the method comprising: forming an underlying layer comprising a second conductive material having surface energy lower than that of the first conductive material on an interior surface of said recess; and plating the surface of the substrate with the first conductive material.

According to the present invention, when the underlying layer as a seed layer is formed by film deposition by sputtering, the seed layer is formed by a conductive material which is hard to be agglomerated or granulated by temperature rise, compared with the conductive material for forming the main conductor. As a result, the seed layer is prevented from being granulated, or the degree of granulation of the seed layer is reduced. Thus, in the subsequent plating process, improper plating or generation of plating defect can be prevented.

Since a material having large surface energy has a greater tendency to decrease its surface area so as to lower the sum total of surface energy in a system, such material tends to be agglomerated or granulated during the sputter deposition process.

In a preferred aspect of the present invention, the second conductive material comprises alloy containing at least one element constituting the first conductive material.

In a preferred aspect of the present invention, the first conductive material comprises copper, and the second conductive material comprises alloy containing copper.

According to the present invention, when copper interconnects are formed in place of aluminum interconnects, pure copper which has been generally used as a conductive material for forming an underlying layer is replaced with copper alloy having lower surface energy than pure copper. Therefore, the underlying layer having a uniform thickness and having no agglomeration and granulation is formed by sputter deposition, for example, and satisfactory interconnects comprising copper and having no defect can be formed.

In a preferred aspect of the present invention, the alloy containing the copper comprises copper-nickel alloy containing at least 5% nickel.

In the case where alloy is prepared by adding nickel to copper, as nickel content increases from zero to a certain percentage, surface energy decreases. At the same time, unlike pure copper, copper-nickel alloy containing at least 5% nickel can form an underlying layer having no granulation or agglomeration.

According to a tenth aspect of the present invention, there is provided an interconnect structure comprising: a fine recess formed in a surface of a substrate; interconnect comprising a conductive material filled in the fine recess; and an underlying layer formed on the recess and underlying the interconnect, the underlying layer comprising a conductive material having lower surface energy than the conductive material for forming the interconnect.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 5 is a graph showing the correlation between sputtering pressure in the chamber and distance between a substrate and a target when sputtering operation is carried out by a method for forming interconnects according to an embodiment of the present invention;

DETAILED DESCRIPTION OF THE PREFERRED EMBODIMENTS

A method and apparatus for forming interconnects according to embodiments of the present invention will be described below with reference to drawings.

Figure 1:
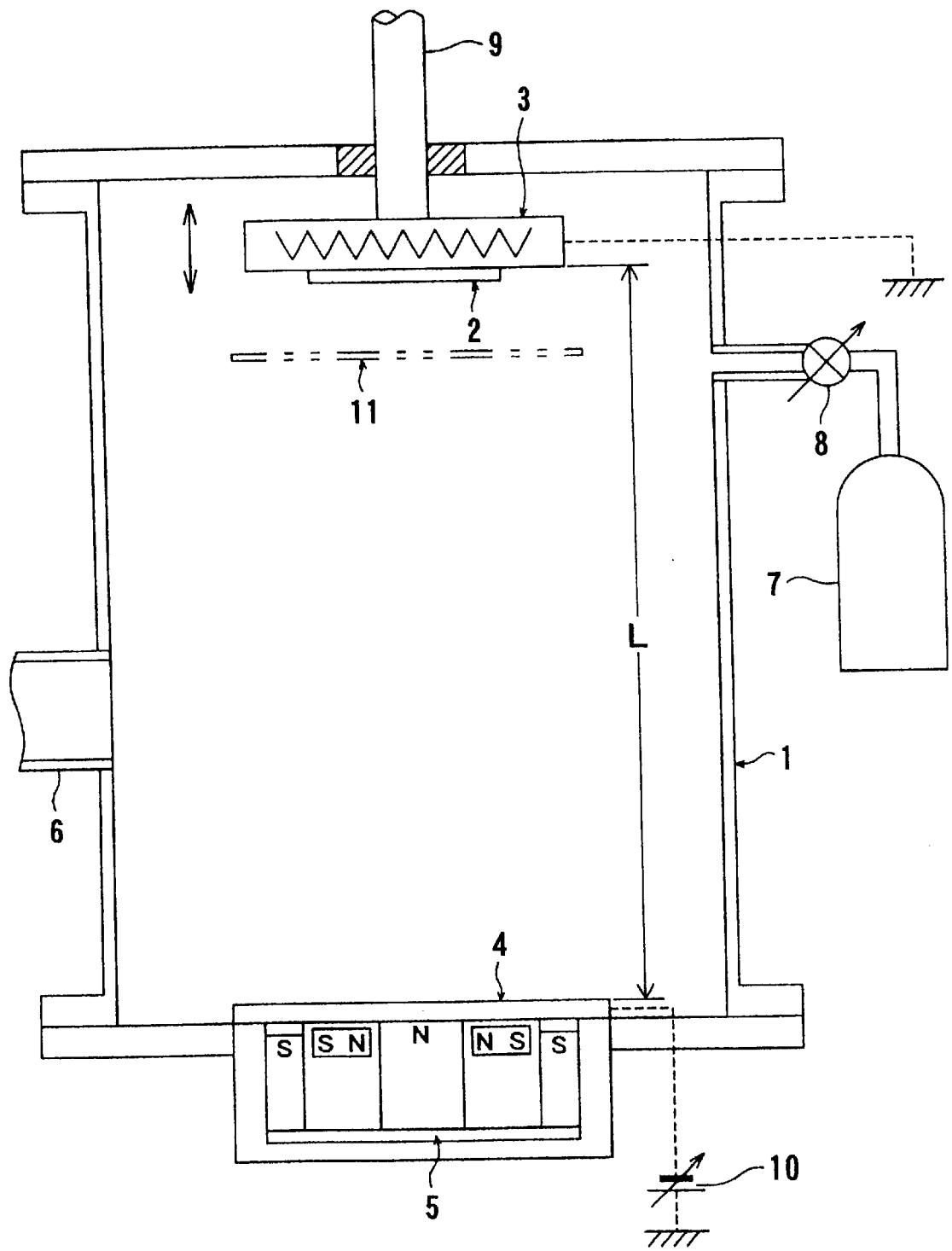
FIG. 1 is a schematic view showing a DC dual electrode magnetron sputtering apparatus for forming interconnects according to an embodiment of the present invention.

FIG. 1 shows a DC dual electrode magnetron sputtering apparatus for forming interconnects according to an embodiment of the present invention. For the sake of convenience for explanation, an example in which argon gas which is generally used as sputtering gas is used and interconnects are formed by sputter deposition of copper in an argon gas atmosphere will be described below.

As shown in FIG. 1, the tool for forming interconnects has a chamber 1, and a vertically movable substrate holder 3 for holding a substrate 2 and a target 4 are disposed in confrontation with each other in the chamber 1. Magnets 5 are provided below the target 4 to form magnetic field in the chamber 1. The interior of the chamber 1 is connected to a vacuum pump (not shown) such as an oil diffusion vacuum pump through an exhaust port 6, and connected to an argon gas source 7 through a flow regulating valve 8. The target 4 is composed of conductive material comprising copper (Cu) in this embodiment, and connected to a cathode of variable output voltage type of a DC power source 10. The substrate holder 3 is grounded. A tube 9 which allows a heating medium or a cooling medium for heating or cooling the substrate 2 to pass therethrough is connected to the substrate holder 3. The substrate 2 may be heated by a heater embedded in the substrate holder 3. Further, a shutter 11 which is freely openable and closable is disposed below the substrate holder 3.

In the above apparatus for forming interconnects, the distance L between the substrate holder 3 and the target 4 is set to 250 mm, the target 4 has a diameter of 120 mm, and the substrate holder 3 has a diameter of 100 m.

For the DC dual electrode magnetron sputtering apparatus for forming interconnects the interior of the chamber 1 is evacuated by the vacuum pump, negative high-voltage of direct current is applied to the target 4 by the DC power source 10, and argon gas is introduced as sputtering gas into the chamber 1 through the flow regulating valve 8. Then, argon gas is ionized and accelerated in the electric field to form high-energy particles, and then the high-energy particles collide with the target 4. By this collision, copper atoms (conductive material particles) are sputtered and emitted from the target 4, and travel straight and are deposited on the surface of the substrate 2, thus forming a thin film (layer) of copper.

Figure 10:
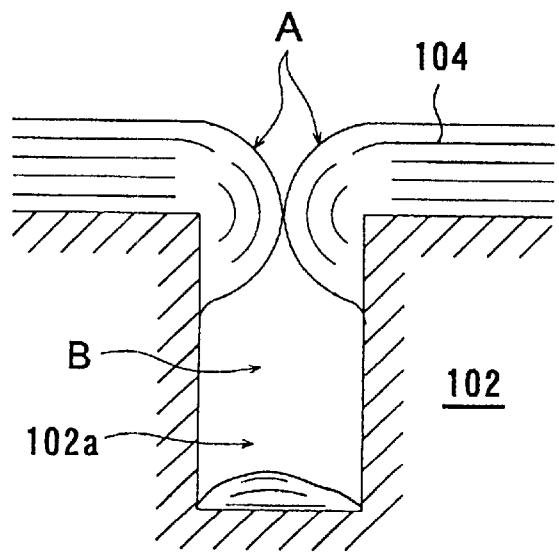
FIG. 10 is a schematic view showing a copper overhang, at an inlet portion of a recess formed in a substrate, generated by copper film deposition by sputtering.
Figure 11:
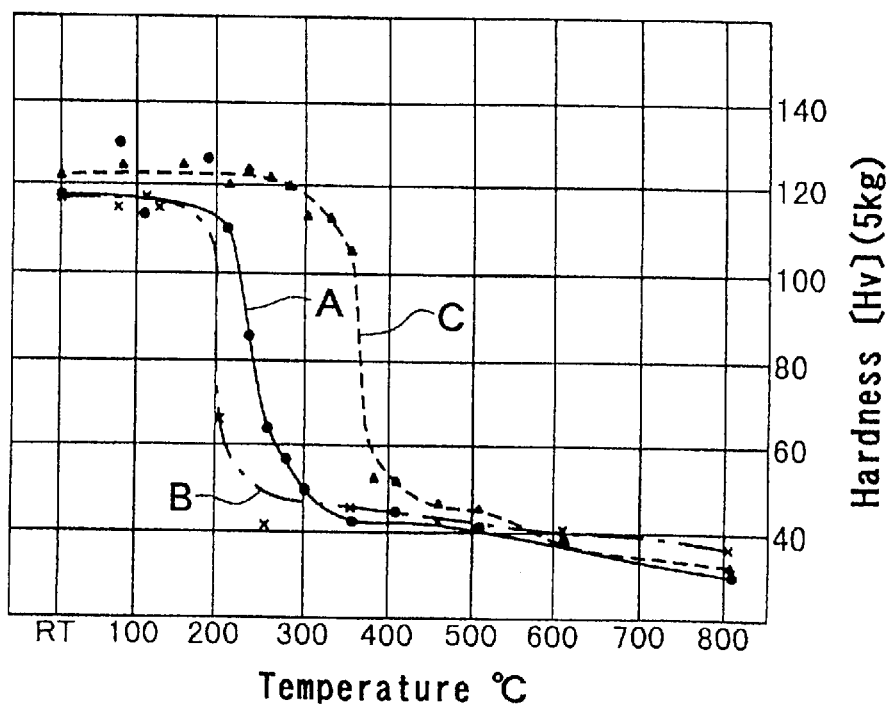
FIG. 11 is a graph showing the relationship between annealing temperature and the hardness of copper.

As described above, copper atoms emitted from the target 4 are deposited on the surface of the substrate 2 to thus form a thin film of copper. However, in the conventional example as shown in FIG. 10, copper 104 is deposited in a concentrated manner at the inlet portion of the minute recess 102a formed in the surface of the substrate 102, thus forming the overhang portion (projecting portion) A. In the present invention, while removing the overhang portion A by sputter etching using neutral reflection argon molecules (atoms) reflected from the surface of the target 4, copper atoms emitted from the target 4 are deposited in the interior of the recess 2a formed in the substrate 2 (see FIGS. 4A through 4C). Accordingly, copper 12 is coated and filled in the interior of the recess 2a, thus forming satisfactory copper interconnects having no defect such as void therein.

In the case where argon gas introduced into the chamber 1 is ionized in the electric field and has high energy, a part of argon gas becomes neutral reflection argon molecules (reflection sputtering gas molecules) after collision, with a considerable amount of kinetic energy, reflected from the surface of the target 4. The magnitude of kinetic energy of the neutral reflection argon molecules is proportional to the potential difference between the substrate 2 and the target 4, and depends on a scattering angle of the neutral reflection argon molecules. (Kinetic Energy of Neutral Reflection Argon Molecules)

Figure 2:
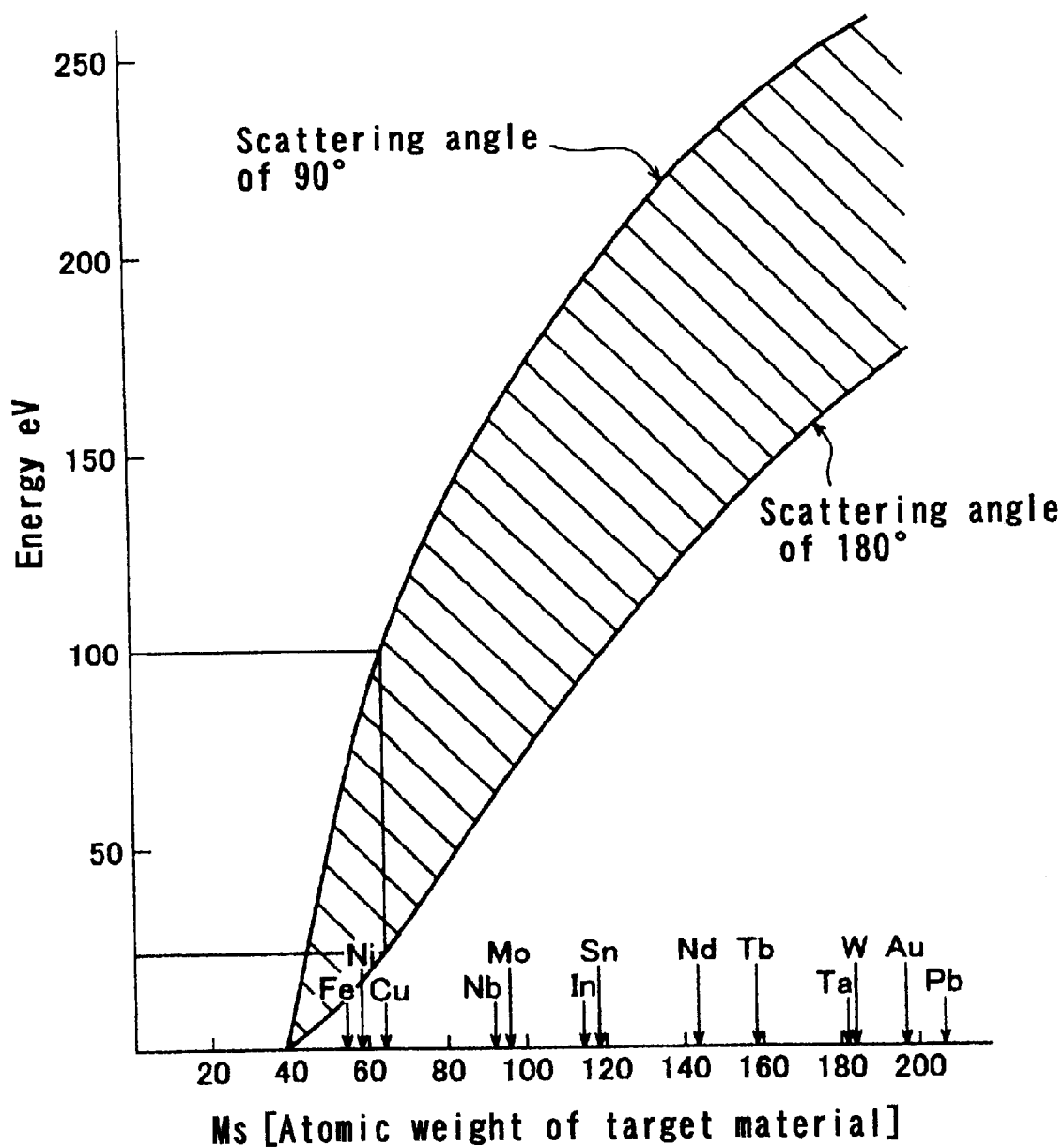
FIG. 2 is a graph showing the relationship between energy of neutral reflection argon molecules and the atomic weight of target materials in an applied voltage of 400 V.

For example, as shown in FIG. 2, when the target 4 is composed of copper and the potential difference between the substrate 2 and the target 4 is 400 V, the kinetic energy of the neutral reflection argon molecules is in the range of 24 to 100 eV. The kinetic energy of the neutral reflection argon molecules largely depends on mass of the target 4. In FIG. 2, the kinetic energy of the neutral reflection argon molecules with a scattering angle of 180° after collision, i.e., the kinetic energy $E_R$ of the neutral reflection argon molecules after head-on collision against the target and reflecting in a perpendicular direction to the surface of the target, is represented by the following equation: (4) [Kobayashi, H., and Hosokawa, N. "Introduction to Thin Film Technology", (Sougou Electronics Press, July, 1992.) p.101.][Kobayashi, H. "Basic Sputtering Thin Film and Application Thereof", (The Nikkan Kogyo Shimbun, Ltd., April, 1998.) p.75.].

$$E_R = [(M_S - M_G) / (M_S + M_G)]^2 E_1 \quad (4)$$

where $M_S$ and $M_G$ represent atomic weight of a target material and sputtering gas, respectively, and $E_1$ represents kinetic energy of the sputtering gas.

In this case, the target 4 comprises copper, and the sputtering gas comprises argon (Ar), and hence $M_S$=64 and $M_G$=40.

Substituting these values into the equation (4) gives the following equation (5).

$$E_R=[(64-40)/(64+40)]^2 E_1$$

$$E_R=0.05E_1 \quad (5)$$

That is, the kinetic energy $E_R$ of the neutral reflection argon molecules equals 5% of the kinetic energy $E_1$ of argon ions which collide with the target 4. (Sputtering of Solid Surface and Applied Voltage)

The minimum value of ion energy required for sputtering solid target atoms is called threshold energy. This threshold energy for engineering metal targets ranges from 30 to 50 eV [Kobayashi, H. "Basic Sputtering Thin Film and Application Thereof", (The Nikkan Kogyo Shimbun, Ltd., April, 1998.) pp. 30–31.]. Therefore, in order to perform sputter etching with neutral reflection argon molecules, it is necessary that the ion energy $E_1$ is set to such a value that the kinetic energy $E_R$ of the neutral reflection argon molecules is equal to or greater than the threshold energy for the solid which is subject to sputter etching. Thus, it is necessary that the following equation (6) holds from the equation (5).

$$E_1 \geq 600 \text{ eV} \quad (6)$$

Figure 3:
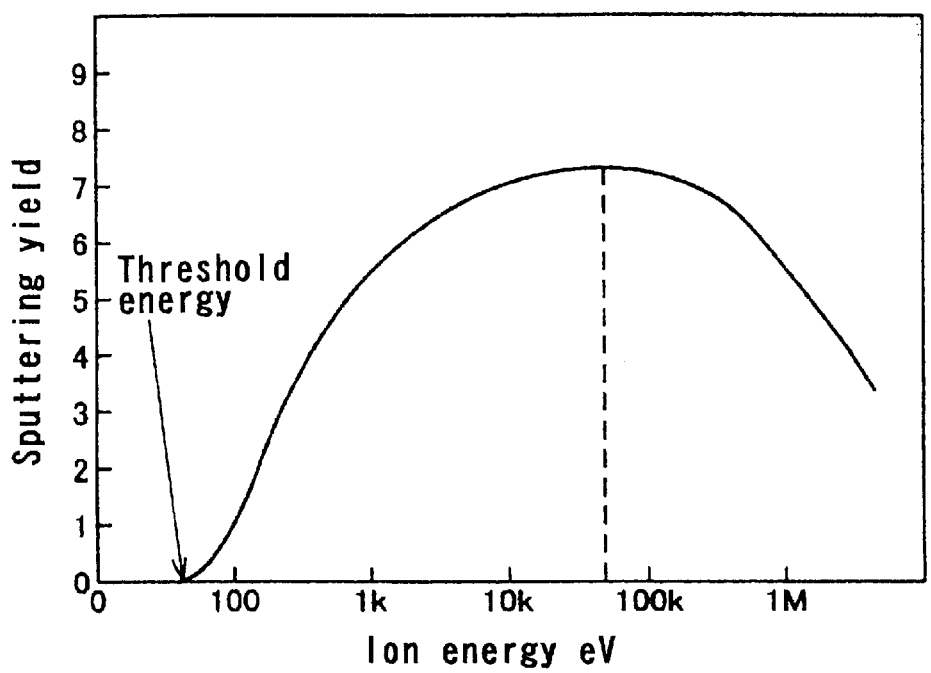
FIG. 3 is a graph showing the relationship between ion energy and sputtering yield.

Next, the relationship between the number of sputtered atoms emitted from the target by collision of one ion with the target (i.e. sputtering yield) and ion energy is shown in FIG. 3 [Kobayashi, H. "Basic Sputtering Thin Film and Application Thereof", (The Nikkan Kogyo Shimbun, Ltd., April, 1998.) pp. 30–31.], [Kobayashi, H., and Hosokawa, N. "Introduction to Thin Film Technology", (Sougou Electronics Press, July, 1992.) p.60.]. As is apparent from FIG. 3, in the case where ion energy is in the range from the threshold energy to 60 kev, as the ion energy increases, the sputtering yield increases monotonously. Therefore, in order to increase the sputtering yield to the maximum, it is desirable that the applied voltage between the target and the substrate is approximately 60 kV. However, in most engineering sputtering apparatuses, the applied voltage between the target 4 and the substrate 2 is lower than 60 kV and is mostly set to a value ranging from 300 to 2000 V [Kobayashi, H., and Hosokawa, N. "Introduction to Thin Film Technology", (Sougou Electronics Press, July, 1992.) p.60.].

When using the sputtering apparatus in a semiconductor device manufacturing process also, it might be considered from FIGS. 2 and 3 and the equation (4) that the applied voltage between the target and the substrate should be set to approximately 60 kV for the maximum sputtering yield and high energy of the neutral reflection argon molecules, respectively. on the other hand, it is considered that in order to avoid damage to silicon semiconductor devices by high energy particles, the allowable energy of the particles which collide with the substrate 2 is equal to or less than 500 eV.

Substituting this value $E_R=500$ eV into the equation (4) gives the following equation (7). The equation (7) means that energy $E_1$ of argon incident on the target is required to be equal to or less than 10 keV (apparent voltage (indicated value) between the target and the substrate is not more than 10 kV)

$$E_1 \leq 10 \text{ keV} \quad (7)$$

It is necessary that the following equation (8) holds from the above equations (6) and (7).

$$600 \text{ eV} \leq E_1 \leq 10 \text{ keV} \quad (8)$$

In conclusion, it is necessary that the applied voltage between the target and the substrate is in the range of 0.6 kV to 10 kV as represented by the following equation (9), and in this range, the sputter etching can be reliably carried out and the semiconductor device can be prevented from being damaged.

$$0.6 \text{ kV} \leq E \leq 10 \text{ kV} \quad (9)$$

Connected with the applied potential, the operating voltage should be as low as possible to avoid any device damage, as long as circumstances permit. Practical dry etching apparatuses also need to use as low energy ions or plasma as possible for the same reason.

If the neutral reflection argon molecules (atoms) generated from the sputtering argon ions generated film the sputtering argon ions having kinetic energy expressed by the equation (8) are mixed with copper particles (atoms) and collide with the surface of the substrate 102 shown in a conventional example of FIG. 10, then the copper 104 deposited on the surface of the substrate 102 by film deposition by sputtering, particularly the copper 104 of the overhang portion A deposited in a relatively thick state on the portion near the inlet of the recess 102*a* is preferentially sputter-etched by the neutral reflection argon molecules. Accordingly, a certain part of the overhang portion A is removed. Thus, the coating and filling of copper progress smoothly into the interior and the depth of the recess 102*a*.

On the other hand, in order to perform effective sputter etching by the neutral reflection argon molecules, the mutual collision induced scattering, or the resultant kinetic energy attenuation of the argon molecules should be suppressed as much as possible. The neutral reflection argon molecules need to travel straight after reflected by the target 4 and collide with the surface of the substrate 2. Thus, pressure in the chamber 1 is required to be set at such a value that the mean free path λ of the neutral reflection argon molecules during process is equal to or greater than the distance L between the target 4 and the substrate 2.

According to kinetic theory of gases, the relationship between the mean free path λ (mm) and the pressure P (Pa) in the chamber 1 is represented by the following equation (10).

$$\lambda = 6.77/P \quad (10)$$

(Derivation of Equation (10))

In the case where T is temperature (K) of gas, δ diameter (m) of gas molecule, P pressure (Pa), and λ mean free path (m), λ is generally represented by the following equation (10.1) ["Revised Edition of vacuum Handbook", (2nd ed., ULVAC JAPAN Ltd., May, 1985.) p.22.].

$$\lambda = 3.11 \times 10^{-24} (T/P\delta^2) \quad (10.1)$$

Assuming that the temperature is 20° C. (293 K) and the kind of gas is only argon, $\delta=3.67\times10^{-10}$ m (when the temperature is 293 K) ["Revised Edition of Vacuum Handbook", (2nd ed., ULVAC JAPAN Ltd., May, 1985.) p.22.]. Substituting the temperature T of gas and the diameter δ of gas molecule into the equation (10.1) gives the following equation (10.2).

$$\lambda = 6.765 \times 10^{-3}/P \quad (10.2)$$

If the equation (10.2) is expressed by millimeter, the equation (10.2) results in the equation (10).

As described above, the pressure in the chamber 1 should be kept at such a value that the mean free path λ (mm) in the equation (10) is equal to or greater than the distance L (mm) between the substrate 2 and the target 4. As a result, the following equation (11) holds.

$$P \leq 6.77/L \quad (11)$$

On the other hand, the distance L between the substrate 2 and the target 4 should be in the range of 50 to 400 mm. That is, as the distance L between the substrate 2 and the target 4 prolongs, the percentage of copper atoms which travel perpendicularly to the substrate increases, and hence this is advantageous in coating or filling of the fine recesses formed in the surface of the substrate 2. However, as the distance L between the substrate 2 and the target 4 becomes longer, the absolute number of conductive particles which reach the surface of the substrate 2 reduces, and hence the resultant deposition rate decreases in inverse proportion to the square of the distance L. Therefore, it is desirable that the maximum of the practical distance L between the substrate 2 and the target 4 is set to approximately 400 mm. On the other hand, as the distance L between the substrate 2 and the target 4 is smaller, collision energy of secondary electrons which collide with the substrate grows larger to damage devices when L≦50 mm. From the viewpoint of the above factors, the distance L between the substrate 2 and the target 4 needs to be in the range of 50 to 400 mm, and approximately 200 mm is optimum. That is, the following equation (12) holds.

$$50 \text{ mm} \leq L \leq 400 \text{ mm} \quad (12)$$

From the equations (11) and (12), it is apparent that the range of operating pressure in the sputter deposition process according to the present invention should be limited to the hatched area in the P-L (operating pressure vs. the distance between the substrate and the target) diagram of FIG. 5. In other words, as shown in FIG. 5, the sputter deposition operating pressure P (Pa) according to the present invention is equal to or less than $1.35 \times 10^{-1}$ Pa when the distance L between the substrate and the target is 50 mm, and is equal to or less than $1.69 \times 10^{-2}$ Pa when the distance L between the substrate and the target is 400 mm. The upper limit of the operating pressures for the distances L between 50 and 400 mm is given by the equation (11), P=6.77/L.

Therefore, as the distance L between the substrate 2 and the target 4 is larger, the allowable upper limit of the operating pressure becomes smaller. From the equations (9) and (12), the variable range of E/L is expressed in the following equation (13).

$$1.5 \leq E/L \leq 200 \quad (13)$$

where the units of E and L are V and mm, respectively.

Figure 4A:
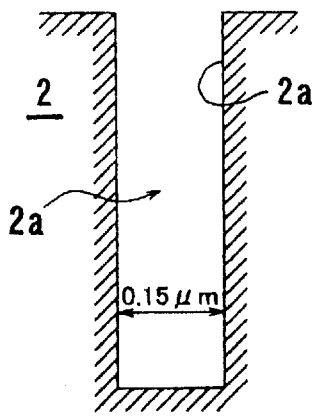
FIGS. 4A through 4C are schematic views illustrating coating or filling of materials into a recess formed in a substrate by an apparatus for forming interconnects according to an embodiment of the present invention.
Figure 4B:
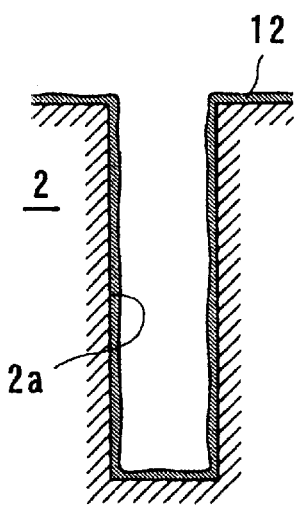
Figure 4C:
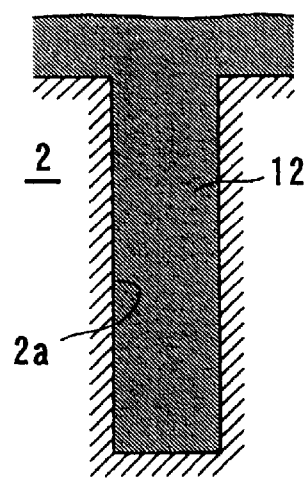

The results in which copper is coated or filled in the recess 2a formed in the substrate 2 under the above conditions are schematically shown in FIGS. 4A through 4C. It was confirmed that as shown in FIGS. 4A through 4C, copper 12 was uniformly and continuously filled into the interior of the deep and fine recess 2a having a width of 0.15 μm or smaller without forming a void, and favorable interconnects of the copper 12 having no defect was obtained. Here, the temperature of the substrate 2 was 200° C., and the pressure in the chamber 1 was $1 \times 10^{-1}$ Pa.

Incidentally, it is generally reported that it is difficult to generate stable high-density plasma in a DC dual electrode sputter deposition system under such a low pressure of $1 \times 10^{-1}$ Pa, different from the usual sputtering pressure. In contrast, in this example, the magnetic field B generated by the magnetron is set to 2,200 G and the externally applied voltage E is set to 6 kV which is remarkably higher than that in the normal process, and hence stable plasma is realized. If E/B is kept constant, then even if the pressure is lower than that for the normal process, stable discharge can be generated.

In the above example, although the target 4 comprises copper, the material of the target 4 is not limited to copper, and silver (Ag), tantalum (Ta), titanium (Ti), tungsten (W), or alloy or compound containing at least one of these elements may be used as the target 4. Further, although the semiconductor wafer is used as a substrate having a fine recess or recesses, the kind of substrate is not limited to the semiconductor wafer.

Argon (Ar) gas is used as sputtering gas introduced into the chamber 1, but the kind of sputtering gas is not limited to argon gas. As long as gas is ionized and accelerated in the chamber 1 to form high energy particles, and does not adversely affect the substrate, any material may be used.

As described above, in this example, neutral reflection argon molecules (reflection sputtering gas particles) are mixed with the conductive material particles emitted from the target and collide with the surface of the substrate to thus perform sputter etching of the conductive material layer deposited on the surface of the substrate, particularly, the conductive material deposited in a relatively thick state on the portion near the inlet of the fine recess preferentially. Therefore, the conductive material particles enter the interior and the depth of the recess, and are easily deposited therein. Thus, the conductive material such as copper reliably fills in the interior of the recess, and the satisfactory interconnects having no defect such as void can be formed. Therefore, even if the recess has a narrow width of, for example, 0.13 to 0.15 μm or less, such recess can be reliably coated and filled with copper, the conductive material, by sputter deposition, although such recess has not heretofore been filled by sputter deposition.

Next, another example of the present invention will be described below. In this example, copper having crystal grains whose diameter is not greater than 70 μm, and preferably not greater than 60 μm is used as a conductive material for a target.

Figure 6:
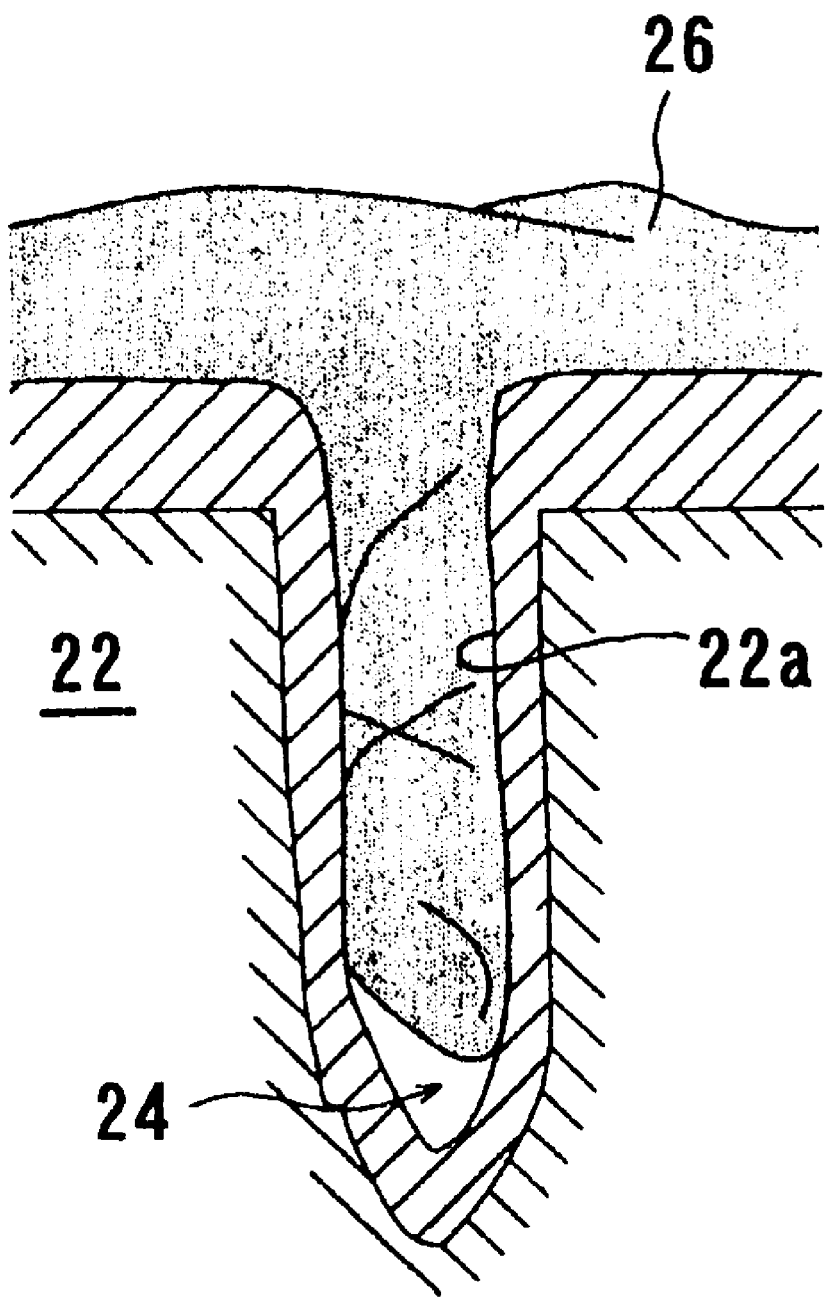
FIG. 6 is a schematic view showing the result in which copper is filled in a minute via formed in the surface of a semiconductor substrate using a copper target comprising crystal grains having a diameter of about 62 $\mu$m.

FIG. 6 schematically shows the results in which copper having small crystal grains whose diameter was 62 μm was used as the target 4, and copper was coated and filled in the recess 22a formed in the substrate 22 under the normal condition. As in this example, by using copper having small crystal grains whose diameter is 62 μm as the target 4, as shown in FIG. 6, copper 26 is filled in almost entire depth of the deep and fine recess 22a having a diameter of about 0.15 μm or smaller while leaving a small void 24 at the deepest portion. It is considered that this is caused by the fact that since the crystal grains of the target 4 become extremely small, there is a strong tendency that copper atoms are sputtered in various traveling directions in accordance with crystal orientation of the respective crystal grains. Specifically, since the copper atoms are emitted in various traveling directions, the copper atoms collide with each other and interfere with each other (the phenomenon similar to elastic scattering), with high frequency. Thus, random traveling directions of copper atoms are averaged, and on the whole, relatively many copper atoms which travel in a direction normal to the surface of the target 4 and the surface of the substrate 22 reach the substrate 22. As a result, filling characteristic to the fine recess 22a formed in the substrate 22 is improved. As crystal grains of various crystal orientations are finer, the effect of averaging of the random traveling directions of copper atoms are more remarkably averaged.

Since a large quantity of sputtering gas ions (here, argon gas ions) having a high speed collide with the target 4 every time the sputter deposition is performed, even if the entire target 4 is forcibly cooled, at least the temperature of the top surface of the target 4 rises more or less in a limited area, up to approximately 550° C. at the maximum. Therefore, while the surface of the target 4 is subject to repetitive cycles of heating and cooling in the range from ambient temperature to the maximum temperature of 550° C. due to repeating operation of the apparatus for forming interconnects, the surface of the target 4 is physically etched (eroded) due to the alternating impacts (microscopically strained) caused by argon ions, thus being subjected to severe hysteresis of damage.

As a result, the portion near the surface of the target 4 is subject to heat hysteresis, a part of which is similar to the heat hysteresis caused by annealing. Therefore, even if the diameter of crystal grains on the top surface of the target 4 is large at the initial stage, the diameter of crystal grains tends to converge on a range determined by the temperature of annealing, i.e., 550° C. shown in FIG. 12, and thus the range of 50 to 60 $\mu$m.

Figure 12:
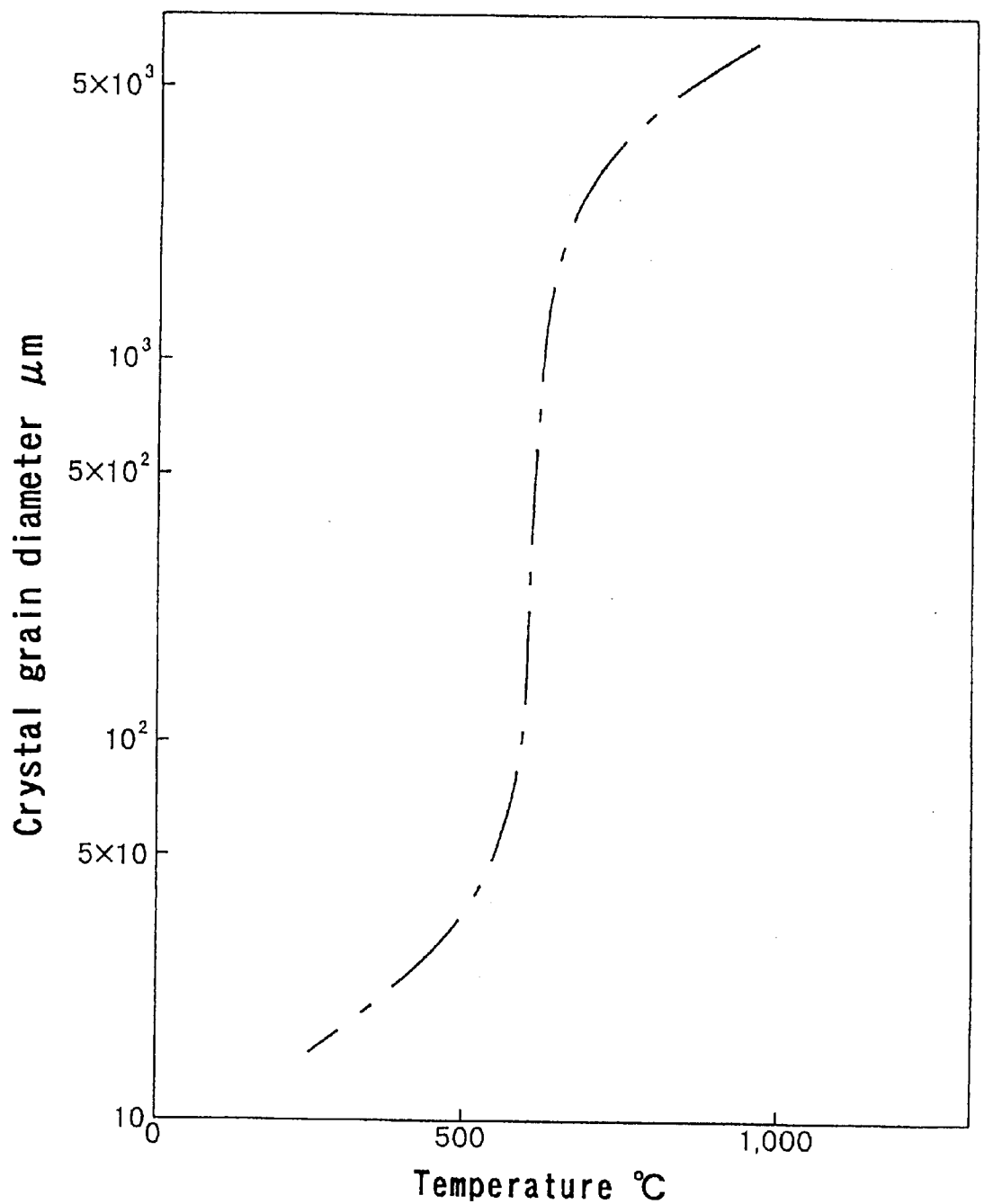
FIG. 12 is a graph showing the relationship between annealing temperature and a crystal grain diameter of pure copper.
Figure 13:
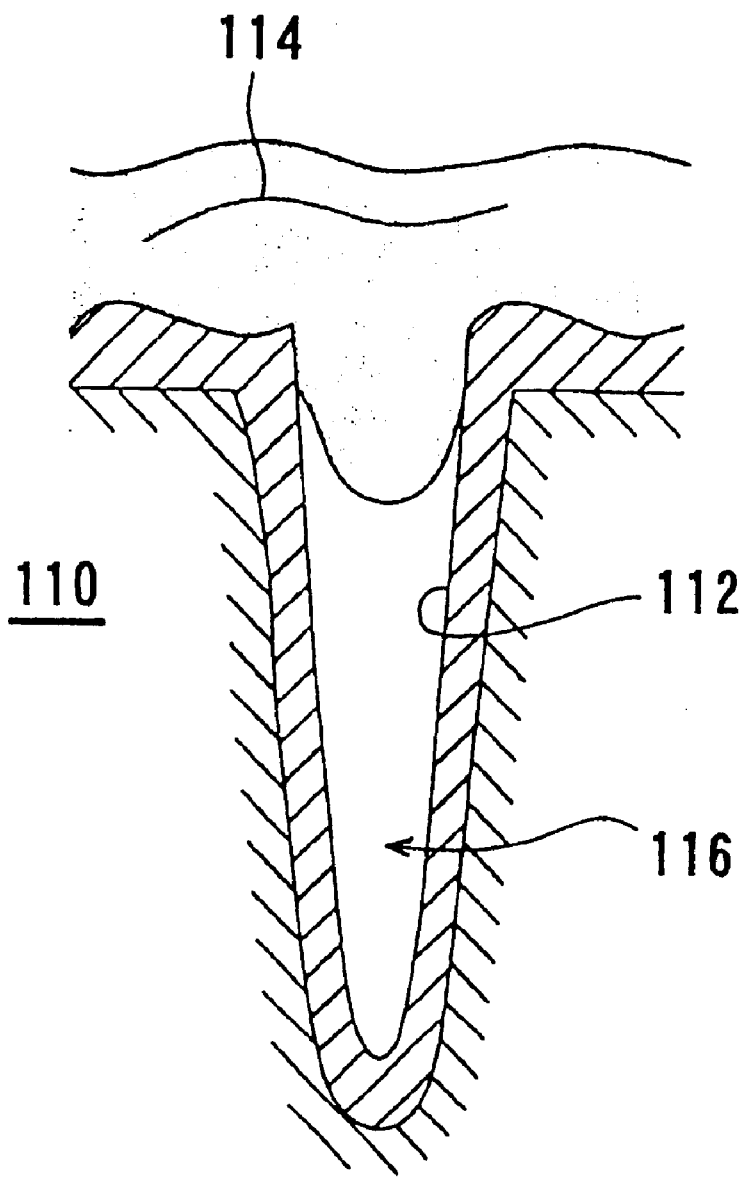
FIG. 13 is a schematic diagram illustrating the results of filling copper into a minute via formed in a surface of a semiconductor substrate using a copper target whose crystal grain diameter is approximately 200 $\mu$m.

If the diameter of crystal grains at the initial stage is larger than 50 to 60 $\mu$m, the effect of averaging of random traveling directions of copper atoms is poor and the crystal grains are subjected to thermal load, which gradually changes the crystal grain diameters to a stable size shown in FIG. 12. Thus, the directions of sputtered copper atoms are influenced by this grain size variation and are extremely unstable. On the other hand, if the diameter of crystal grains at the initial stage is smaller than 50 to 60 $\mu$m, traveling directions of the copper atoms are averaged from the initial stage and the diameter of crystal grains gradually grows, and finally the diameter of the crystal grains becomes in the range of 50 to 60 $\mu$m. Therefore, the direction of the sputtered atoms is held in a direction perpendicular to the surface of the target 4. As a result, coating and filling of copper progress stably in a steady state, and the sputtered copper atoms reach the deepest portion of the fine recess 22a formed in the surface of the substrate 22 and are deposited therein.

For the film deposition by general purpose sputtering apparatuses based on conventional technology, the applied voltage between the substrate 2 and the target 4 is normally considered to be less than 1000 V, for example, approximately 400 V.

However, there are some cases where the applied voltage between the substrate 2 and the target 4 is preferably higher than the above mentioned normal voltage, for instance, in the case where a material of the target 4 is coated, or filled in the interior of the recess formed in the substrate 2 to metalize semiconductor devices.

In such case also, if a material composed of crystal grains whose diameter is not greater than 60 $\mu$m is used as the target 4, the neutral reflection argon molecules reflected toward every direction interfere with each other and are averaged on the whole, and only the neutral reflection argon molecules which travel in a direction perpendicular to the surface of the target 4 reach the substrate 2. As a result, since there is a strong tendency that only the overhang portion deposited on the area near the inlet of the recess 22a is selectively removed by sputter etching and the effectively filled portion is protected against being damaged, coating or filling capability is improved for the fine recess 22a formed in the substrate 22. Therefore, the present invention exhibits remarkable effect in the case where the applied voltage between the substrate 2 and the target 4 (see FIG. 1) is considerably higher than the normal voltage, particularly the applied voltage is not less than 1000 V.

In the above example, as conductive materials constituting the target 4, copper having crystal grains whose diameter is not more than 70 $\mu$m, preferably not more than 60 $\mu$m is used. However, other copper alloy or conductive material may be used, as long as the diameter of crystal grains is not more than 70 $\mu$m, preferably not more than 60 $\mu$m. Further, the substrate 2 is not limited to a semiconductor substrate, and any substrate having fine recess or recesses for interconnects may be used. Further, the sputtering gas is not limited to argon gas.

As described above, in this example, the conductive material composed of crystal grains whose diameter is not more than 70 $\mu$m, preferably not more than 60 $\mu$m is used as the target material, and hence oblique traveling characteristic of conductive particles which have been sputtered is suppressed on the whole, and the conductive particles enter the deepest portion of the fine recess formed in the surface of the substrate and are deposited therein. Therefore, the conductive material such as copper can be reliably coated and filled in the recess to enable satisfactory interconnects having no defect such as void. Therefore, even if the recess has a narrow width of, for example, 0.13 to 0.15 $\mu$m or less, such recess can be reliably coated and filled with the conductive material of copper by film deposition by sputtering, although such recess has not heretofore been filled by conventional film deposition by sputtering.

Another example according to the present invention in which fine interconnects of copper (copper wiring) is formed by filling minute recesses using electroplating of copper will be described below.

Figure 7A:
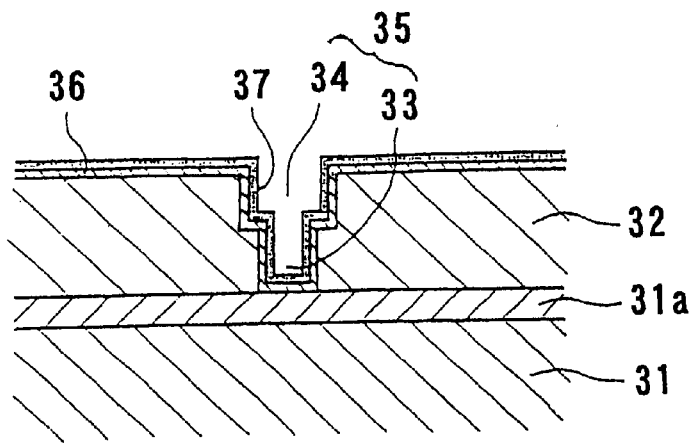
FIGS. 7A through 7C are cross-sectional views showing processes of forming interconnects in a method for wiring according to another embodiment of the present invention.
Figure 7B:
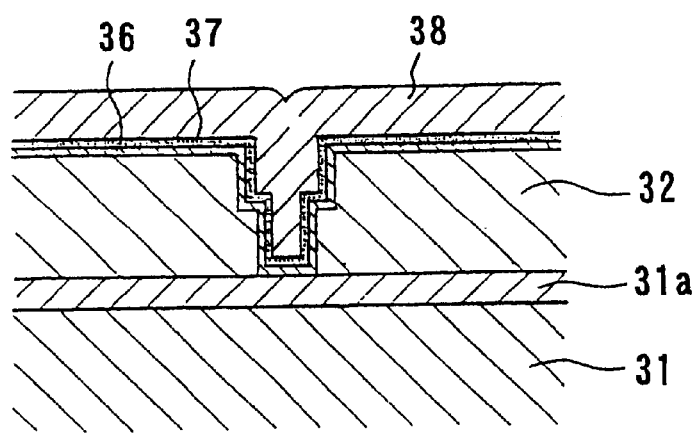
Figure 7C:
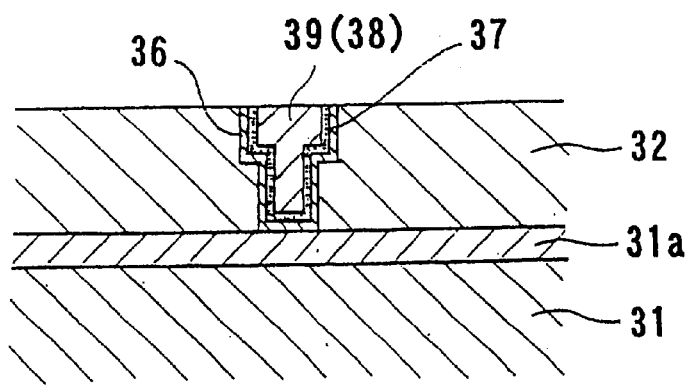

FIGS. 7A through 7C show successive steps of manufacturing copper interconnects for a semiconductor. As shown in FIG. 7A, an oxide film 32 of $SiO_2$ is deposited on a conductive layer 31a on a semiconductor substrate 31 on which semiconductor devices are formed. Then, a fine recess 35 comprising a via hole 33 and a trench 34 for a predetermined interconnect pattern in the oxide film 32 by lithography and etching. Thereafter, a barrier layer 36 of TaN or the like is formed, and then a seed layer 37 to supply electric current for electroplating is formed on the barrier layer 36 by film deposition by sputtering.

Then, as shown in FIG. 7B, the entire surface of the barrier layer 36 is coated with copper by electroplating to deposit a copper layer 38 on the entire surface, thus filling the recess 35 with copper. Thereafter, the copper layer 38 on the barrier layer 36 and the barrier layer 36 are removed by chemical mechanical polishing (CMP), thus making the copper layer 38 in the via hole 33 and the trench 34 lie flush with the oxide film 32. In this manner, an interconnect 39 composed of the copper layer 38 is produced as shown in FIG. 7C.

The seed layer 37 is composed of a material having surface energy which is lower than that of the material for forming the interconnect 39, i.e. copper. For example, the seed layer 37 is composed of copper-nickel alloy containing at least 10% nickel. Thus, when the seed layer 37 is formed by film deposition by sputtering, the seed layer 37 is prevented from being granulated, or the degree of granulation of the seed layer 37 is reduced. As a result, in the subsequent plating process, improper plating or generation of plating defect can be prevented. Since a material having large surface energy tends to decrease its surface area so as to lower the sum total of surface energy in a system, there is a strong tendency that such material is agglomerated or granulated during the sputtering deposition. However, in the present invention, since the seed layer is composed of copper-nickel alloy having small surface energy, the tendency of agglomeration or granulation of material remaining weakened.

In case of conventional copper interconnects forming, the seed layer is formed with pure copper which is the same material as that for interconnects. In this case, pure copper is deposited on the barrier layer comprising TaN or the like by film deposition by sputtering to form the seed layer, copper atoms are agglomerated at a high temperature to form granular rough surface, and it is difficult to obtain a continuous and thin film having a uniform thickness. On the other hand, as in this example, the seed layer is formed with copper-nickel alloy containing at least 10% nickel, and hence the thin film (seed layer) having a uniform thickness can be obtained.

In the case where the metal is agglomerated at a high temperature on the surface of the substrate to change its shape into a granular shape, the mechanism generally involves various complicated factors including external factors such as a temperature of substrate, a temperature, concentration, pressure, or flow rate of gas, or the like, and internal factors such as property of the substrate or metal deposited on the substrate, and the degree of interaction between the metal and the substrate. Here, only specific surface energy of the deposited metal is taken into consideration, because the sputter deposition behavior is well interpreted in terms of the minimum surface energy concept, i.e., high surface energy materials have a strong tendency to cause large scale agglomeration or granulation to decrease the sum total of the surface area of the deposited material.

The detailed mechanism of this will be described below.

(Surface Energy of Solid Materials)

There have been several methods for measuring surface energy of solid materials. In this paper, the relationship between the surface energy and an external load to cause a brittle fracture of a solid material will be explained below. Metallic materials are, more or less ductile as to have fewer tendencies to fail in a complete brittle manner. In order to simplify the surface energy estimation of metals, the following equation (14) is used for approximation.

$$\gamma = 6\frac{F^2 L^2}{EW^2 t^3} \quad (14)$$

where γ represents the surface energy specific to a solid material, L represents the initial crack length of a fracture toughness test specimen, W represents the width of the specimen, t represents the thickness of the specimen, F represents the required load for the onset of the crack growth, and E represents the Young's modulus specific to a solid material.

It is apparent from the equation (14) that the surface energy is inversely proportional to the Young's modulus. Therefore, when the Young's modulus of a material is given, the surface energy of the material can be evaluated from the equation (14).

Here, the surface energy of alloy containing copper and nickel as main components will be described below. The Young's moduli of pure copper and two kinds of Cu—Ni alloys are listed in Table 1. The surface energy of copper is reported in the reference (3) to be approximately 1670 erg/cm².

TABLE 1

| approximate Composition | Young's moduli |
|---|---|
| 100% Cu | 110 GPa |
| 10% Ni—Cu | 123 |
| 67% Ni—Cu | 179 |

The surface energy of two kinds of Cu—Ni alloys can be calculated from the surface energy of copper, the equation (14), and the values listed in Table 1. The results of the calculation are listed in Table 2.

TABLE 2

| (approximate) composition | Surface energy |
|---|---|
| 100% Cu | 1,670* erg/cm² |
| 10% Ni—Cu | 1,493 |
| 67% Ni—Cu | 1,026 |

*measured value in the reference (3)

Reference (3): Osamu Suetaka, Boundary Layer Property, Maruzen, June, 1976, p.21.

It is apparent from Table 2 that, when nickel is added as an alloying element to copper, the surface energy decreases as a content of nickel increases.

(Deposition Experiments of Film Deposition by Sputtering)

Figure 8:
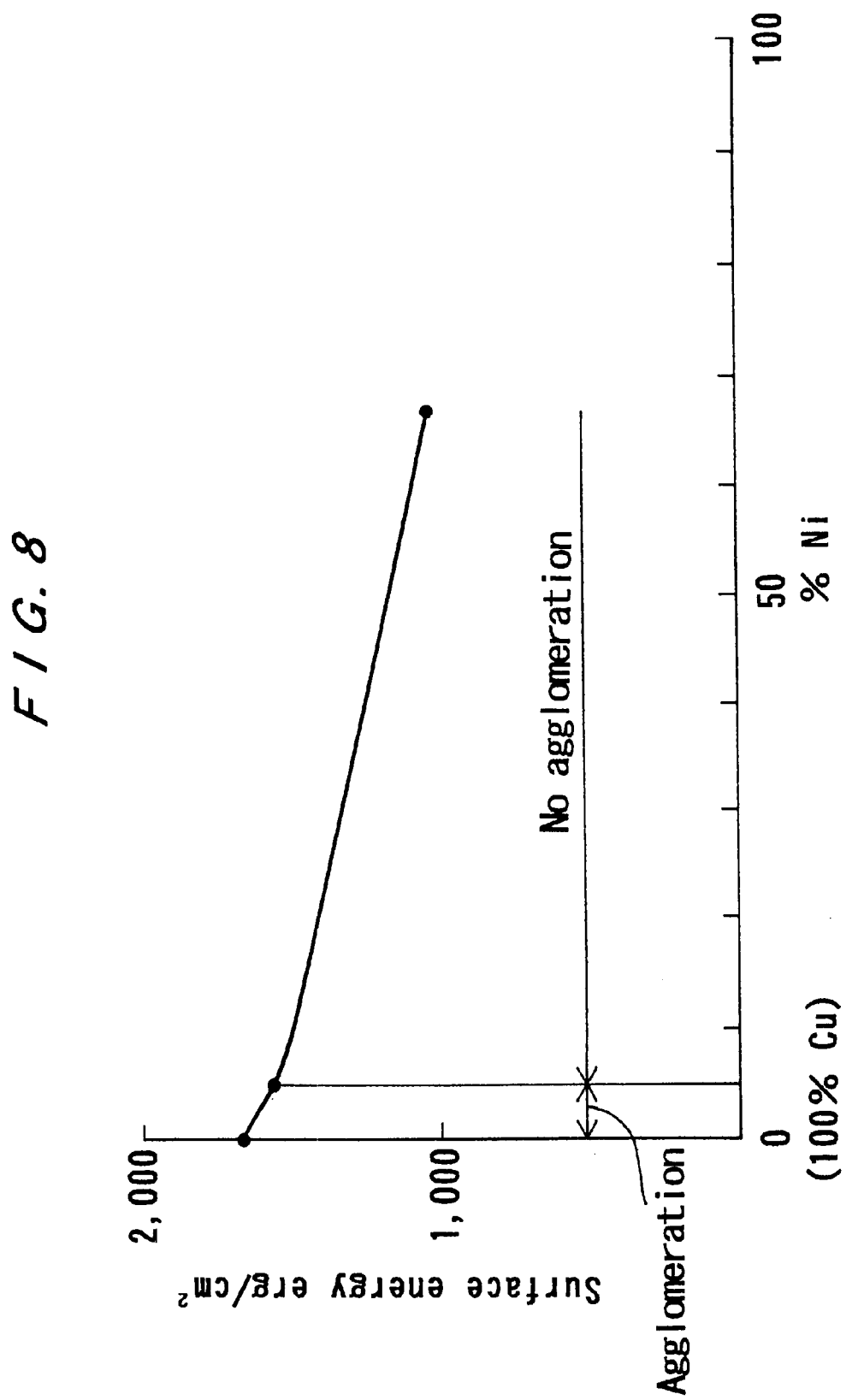
FIG. 8 is a graph showing the relationship between surface energy of Cu—Ni alloy and Ni concentration obtained by sputter deposition of the Cu—Ni alloy.

The correlation between the surface energy listed in Table 2, and the degree of agglomeration and granulation for film deposition by sputtering were examined by experiments. The results of the experiments are shown in FIG. 8. It can be found from FIG. 8 that, when Cu—Ni alloy containing nickel of at least 5% is used as a target, a seed layer can be obtained without agglomeration and granulation, differently from the case where pure copper is used.

From the results of the experiments, Cu—Ni alloy containing at least 5% nickel can provide a satisfactory film without agglomeration of sputtering deposited atoms. A curved line shown in FIG. 8 represents a lowering tendency of the surface energy (see Table 2) in accordance with increase of a nickel content. Specifically, FIG. 8 shows that the lowered surface energy corresponds with no agglomeration. Therefore, it is adequate to predict depending on the surface energy of materials as a proper measure whether deposited atoms are agglomerated and granulated or not.

(Amount of Additional Element and Electrical Resistance)

Next, increase in specific electric resistivity which is caused by adding an alloying element to copper will be described below. The electric resistivity of Cu—Ni alloy is listed in Table 3.

TABLE 3

| (approximate) composition | Electric resistivity $\mu \Omega$ cm |
|---|---|
| 100% Cu | 1.673 |
| 10% Ni—Cu | $1.85 \times 10^3$ |
| 67% Ni—Cu | $4.82 \times 10^3$ |

It is apparent from Table 3 that a small amount of nickel simply added to pure copper greatly increases the electric resistivity over 1,000 times larger than pure copper. The degree of disadvantages caused by this phenomenon will be discussed below.

Figure 9:
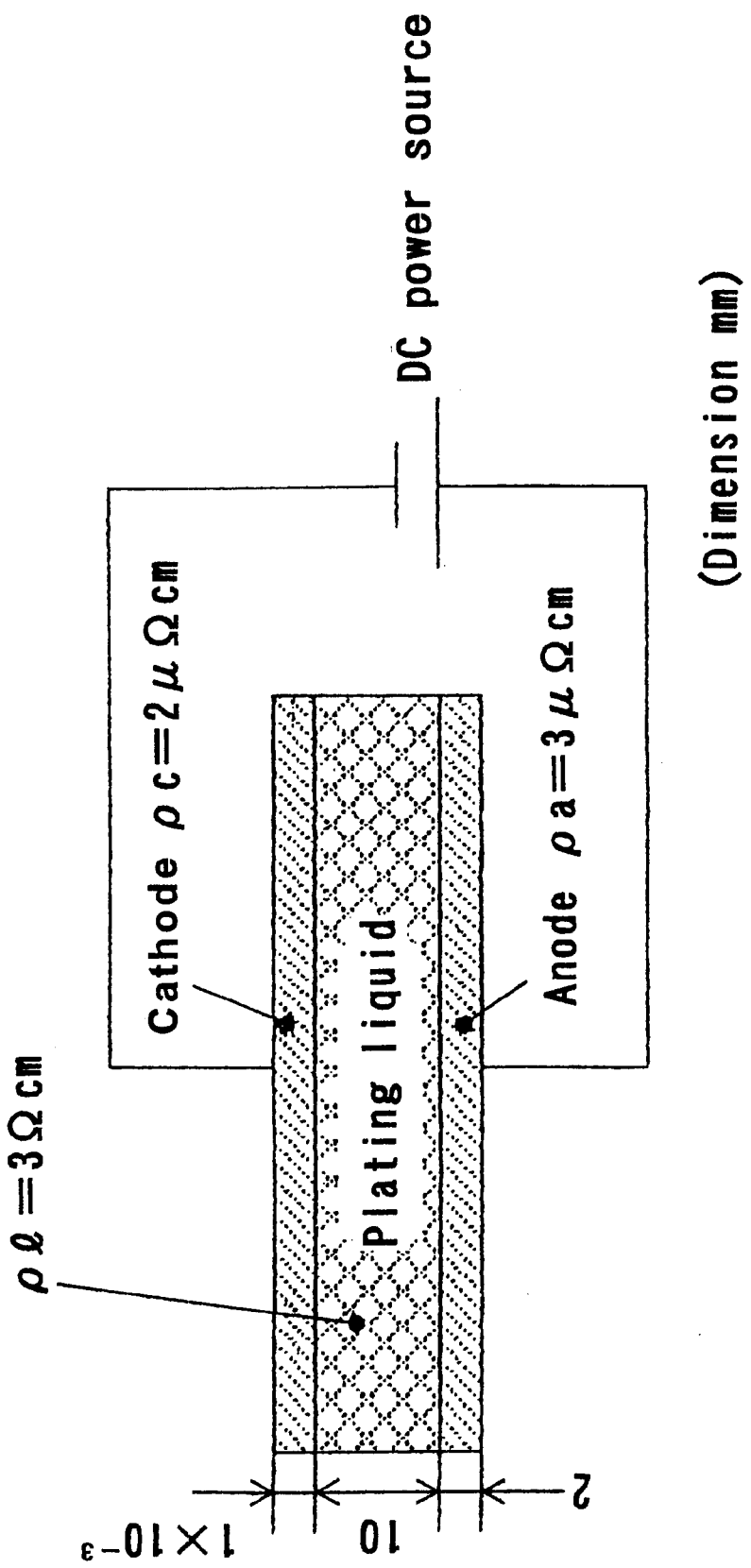
FIG. 9 is a schematic view showing a practical plating cell.

FIG. 9 shows a schematic illustration of an electroplating cell used to plate metal on a semiconductor wafer. In FIG. 9, ρc represents the electric resistivity of a cathode (seed layer), ρa represents that of an anode (Cu—P alloy), and ρ1 represents that of a plating liquid. As shown in FIG. 9, the electric resistivity ρ1 of the plating liquid is about 1,000,000 times larger than ρc and ρa, the electric resistivity of the cathode and the anode, respectively. Further, when thickness along an overall current direction is taken into consideration, the electrical resistance of the plating liquid occupies substantially 100% of the electric resistance of the whole circuit. Therefore, as listed in Table 3, even though the electric resistivity of the seed layer (cathode) increases to be about 1,000 times larger than that of pure copper by adding a small amount of nickel to pure copper, the electrical resistance of the plating circuit system still remains substantially equal to the electrical resistance of the plating liquid.

On the other hand, advantages of copper interconnects will be described in detail, taking the line width for semiconductor device interconnects into consideration. The electric resistivity of copper is as small as 63% of that of aluminum. Therefore, as long as the seed layer is thinner than a whole line width, e.g., the seed layer is as thin as 20 nm, even if the electrical resistance of the seed layer increases, the copper interconnects maintain the advantages over conventional aluminum interconnects when they are used as conductive lines for semiconductor devices.

(Limitation of Cu—Ni Component)

As described above, in the case of Cu—Ni alloy used for a seed layer, a nickel content can be determined substantially independently of the electric resistivity increase which is caused by adding nickel to pure copper. In other words, an amount of nickel to be added to pure copper can simply be determined based on the graph shown in FIG. 8. As shown in FIG. 8, an allowable lower limit of the nickel content is 5%. However, in consideration of the safety factor, the nickel content should preferably be 10% or higher.

In the above example, the seed layer is formed of Cu—Ni alloy. However, copper may be alloyed with a metallic element other than nickel to form the seed layer. Further, any other metallic material may be used to form the seed layer. Specifically, since usual engineering metals have extremely smaller electric resistivity than the plating liquid, a large variety of metals may be used to form the seed layer.

As described above, according to this example, in the sputter deposition process for forming an underlayer, e.g., a seed layer, granulation of the seed layer can be avoided, or the degree of granulation of the seed layer can be suppressed to form the continuous seed layer (underlying layer) having a uniform thickness on an inner circumferential surface of a minute recess. Therefore, improper plating or plating defect in a subsequent plating process can be prevented.

Although certain preferred embodiments of the present invention have been shown and described in detail, it should be understood that various changes and modifications may be made therein without departing from the scope of the appended claims.

What is claimed is:

1. A method for forming an interconnect on a substrate by filling a conductive material in a fine recess formed in a surface of the substrate, the method comprising:

providing a substrate and a target composed of a conductive material in confrontation with each other in a chamber;

introducing a sputtering gas into said chamber while a high voltage is applied between said substrate and said target to cause said sputtering gas to collide with said target; and depositing particles of said conductive material emitted from said target on said surface of said substrate to form a thin film, while sputter-etching said thin film by reflection sputtering gas molecules reflected from said target and having high energy.

2. A method according to claim 1, wherein a potential difference E(V) between said substrate and said target is set to a range which is expressed by the following equation (1);

$$30/A \leq E \leq 500/A \quad (1)$$

here, $$A = [(M_S - M_G)/(M_S + M_G)]^2$$

where $M_S$ represents atomic weight of said target, and $M_G$ represents atomic weight of said sputtering gas; and the distance L (mm) between said substrate and said target is set to a range which satisfies the following equations (2) and (3);

$$\lambda \geq L \quad (2)$$

$$50 \leq L \leq 400 \quad (3)$$

where λ (mm) represents mean free path of said reflection sputtering gas molecules.

3. A method according to claim 2, wherein said sputtering gas comprises argon gas, and a pressure P (Pa) in said chamber is set to a range which satisfies $P \leq 6.77/L$.

4. A method according to claim 2, wherein said sputtering gas comprises argon gas, said target comprises copper, and said potential difference E between said substrate and said target is in the range of 0.6 to 10 kV.

5. A method according to claim 1, wherein said substrate comprises a semiconductor substrate, and said target comprises copper, tantalum, titanium, tungsten, or an alloy containing at least one of these elements.

6. A method for forming an interconnect on a substrate by filling a conductive material in a fine recess formed in a surface of the substate, the method comprising:

providing a substrate and a target composed of a conductive material having crystal grains whose diameter is not greater than 70 μm in confrontation with each other in a chamber;

introducing a sputtering gas into said chamber while a high voltage is applied between said substrate and said target to cause said sputtering gas to collide with said target, wherein said high voltage applied between said substrate and said target is equal to or more than 1000 V; and depositing particles of said conductive material emitted from said target by collision of said sputtering gas on said surface of said substrate to form a thin film.

7. A method for forming an interconnect on a substrate by filling a conductive material in a fine recess formed in a surface of the substrate, the method comprising:

providing a substrate and a target composed of a conductive material having crystal grains whose diameter is not greater than 60 μm in confrontation with each other in a chamber;

introducing a sputtering gas into said chamber while a high voltage is applied between said substrate and said target to cause said sputtering gas to collide with said target, wherein said high voltage applied between said substrate and said target is equal to or more than 1000 V; and depositing particles of said conductive material emitted from said target by collision of said sputtering gas on said surface of said substrate to form a thin film.

8. A method for forming an interconnected on a substrate by filling a first conductive material in a fine recess formed in a surface of the substrate with plating, said method comprising:

forming an underlying layer comprising a second conductive material having surface energy lower than that of said first conductive material on an interior surface of said recess, wherein said second conductive material comprises an alloy containing at least one element constituting said first conductive material, wherein said first conductive material comprises copper, and said second conductive material comprises an alloy containing copper, wherein said alloy containing copper comprises a copper-nickel alloy containing at least 5% nickel; and plating said surface of said substrate with said first conductive material.

* * * * *